US011545734B2

(12) United States Patent
An et al.

(10) Patent No.: US 11,545,734 B2
(45) Date of Patent: Jan. 3, 2023

(54) ANTENNA APPARATUS

(71) Applicant: Samsung Electro-Mechanics Co., Ltd, Suwon-si (KR)

(72) Inventors: Sungyong An, Suwon-si (KR); Chin Mo Kim, Suwon-si (KR); Jungil Kim, Suwon-si (KR); Juhyoung Park, Suwon-si (KR); Daeki Lim, Suwon-si (KR)

(73) Assignee: Samsung Electro-Mechanics Co., Ltd., Suwon-si (KR)

(*) Notice: Subject to any disclaimer, the term of this patent is extended or adjusted under 35 U.S.C. 154(b) by 32 days.

(21) Appl. No.: 17/202,640

(22) Filed: Mar. 16, 2021

(65) Prior Publication Data

US 2022/0158327 A1 May 19, 2022

(30) Foreign Application Priority Data

Nov. 16, 2020 (KR) ........................ 10-2020-0152676

(51) Int. Cl.
*H03M 1/38* (2006.01)
*H01Q 1/22* (2006.01)
*H01Q 5/335* (2015.01)
*H01Q 1/38* (2006.01)

(52) U.S. Cl.
CPC ............. *H01Q 1/2283* (2013.01); *H01Q 1/38* (2013.01); *H01Q 5/335* (2015.01)

(58) Field of Classification Search
CPC ......... H01Q 1/2238; H01Q 5/535; H01Q 1/38
USPC .......................................................... 343/702
See application file for complete search history.

(56) References Cited

U.S. PATENT DOCUMENTS

| | | | | |
|---|---|---|---|---|
| 8,749,434 B2* | 6/2014 | Han | H01Q 1/40 343/702 |
| 2008/0106469 A1* | 5/2008 | Kikkawa | H01L 23/48 343/700 MS |
| 2009/0009402 A1 | 1/2009 | Fujii | |
| 2019/0221917 A1* | 7/2019 | Kim | H01Q 1/2283 |
| 2019/0319350 A1 | 10/2019 | Sakurai | |
| 2020/0185815 A1 | 6/2020 | Lee et al. | |

FOREIGN PATENT DOCUMENTS

| | | |
|---|---|---|
| KR | 10-2008-0092278 A | 10/2008 |
| KR | 10-2084450 B1 | 3/2020 |
| KR | 10-2020-0068871 A | 6/2020 |

* cited by examiner

*Primary Examiner* — Peguy Jean Pierre
(74) *Attorney, Agent, or Firm* — NSIP Law

(57) ABSTRACT

An antenna device is provided. The antenna device includes an antenna body portion configured to transmit and/or receive a radio frequency (RF) signal, and including a dielectric material having a first dielectric constant; a metal layer configured to contact the antenna body portion; a first insulation layer configured to cover at least a part of the metal layer; and an electrical connection structure configured to be electrically connected to the metal layer, wherein the first dielectric constant of the antenna body portion is larger than a dielectric constant of the first insulation layer, and is smaller than a dielectric constant of the metal layer.

20 Claims, 16 Drawing Sheets

100

ANTENNA APPARATUS

CROSS-REFERENCE TO RELATED APPLICATIONS

This application claims the benefit under 35 USC § 119(a) to Korean Patent Application No. 10-2020-0152676 filed on Nov. 16, 2020, in the Korean Intellectual Property Office, the entire disclosure of which is incorporated herein by reference for all purposes.

BACKGROUND

1. Field

The following description relates to an antenna device.

2. Description of Related Art

Data traffic associated with mobile communication systems is increasing rapidly every year. Active technology development is being implemented to support the rapidly increasing data in real-time in a wireless network. For example, applications that process content related Internet of Things (IOT)-based data, augmented reality (AR), virtual reality (VR), live VR/AR combined with SNS, autonomous driving, sync view (real-time image transmission from the user's perspective using an ultra-small camera), and the like utilize communication (e.g., fifth-generation (5G) communication, mmWave communication, and the like) that supports the transmission and reception of large amounts of data.

Thus, recently, millimeter wave (mmWave) communication including 5G communication has been actively implemented.

A radio frequency (RF) signal with a high frequency bandwidth (e.g., 24 GHz, 28 GHz, 36 GHz, 39 GHz, 60 GHz, and the like) is easily absorbed which leads to data loss during the transmission process, and thus the quality of communication may be deteriorated rapidly. Thus, an antenna that transmits high frequency bandwidth signals may need a different technical approach from the typical antenna technology, and special technological developments such as an additional power amplifier that obtains antenna gain, and that integrates antenna and radio frequency integrated circuit (RFIC), secures effective isotropic radiated power (EIRP), and the like may be necessary.

The above information is presented as background information only to assist with an understanding of the present disclosure. No determination has been made, and no assertion is made, as to whether any of the above might be applicable as prior art with regard to the disclosure.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, an antenna device includes an antenna body portion, configured to transmit and/or receive a radio frequency (RF) signal, and comprising a dielectric material configured to have a first dielectric constant; a metal layer, configured to contact the antenna body portion; a first insulation layer, configured to cover at least a part of the metal layer; and an electrical connection structure, configured to be electrically connected to the metal layer, wherein the first dielectric constant of the antenna body portion is larger than a dielectric constant of the first insulation layer, and is smaller than a dielectric constant of the metal layer.

The first insulation layer may include a first opening, and the electrical connection structure is disposed inside the first opening.

The antenna device may include a first feed via, configured to feed to the antenna body portion.

The metal layer may include a first opening, the first feed via may be disposed inside the first opening of the metal layer, and the first feed via and the metal layer may be separated from each other.

The first insulation layer may be configured to surround the first feed via, while contacting the first feed via.

The antenna device may include a second feed via, configured to feed to the antenna body portion, wherein a first RF signal passing through the first feed via, and a second RF signal passing through the second feed via may be polarized to each other.

The antenna device may include a strip pattern configured to be electrically connected to the first feed via, and configured to extend in a direction that is away from the first feed via.

The antenna body portion may include a first dielectric material block, a polymer layer that is disposed on the first dielectric material block, and a second dielectric material block that is disposed on the polymer layer.

The antenna device may include a first feed via, configured to penetrate at least a part of the first dielectric material block; and a first metal patch, that is disposed on a top surface of the first dielectric material block, and is electrically connected to the first feed via.

The antenna device may further include a second metal patch that is disposed on a top surface of the second dielectric material, and is coupled with the first metal patch.

The antenna device may further include a second insulation layer, configured to cover the second metal patch.

The metal layer may contain more than 0 wt % and less than or equal to about 5 wt % of glass based on a weight of the metal layer.

In a general aspect, an antenna device includes an antenna body portion, configured to transmit and/or receive a radio frequency (RF) signal; a metal layer, comprising a first surface configured to contact a first surface of the antenna body portion, and configured to have a planar shape that overlaps at least a part of edges of the first surface of the antenna body portion; an insulation layer, disposed on a second surface of the metal layer, and configured to have a planar shape that overlaps at least a part of edges of the second surface of the metal layer; and an electrical connection structure, configured to contact at least a part of the second surface of the metal layer.

The electrical connection structure may be disposed inside a first opening of the insulation layer.

The antenna device may further include a first feed via, configured to be connected to a bottom surface of the antenna body portion The first feed via and the metal layer may be separated from each other.

The first feed via may be disposed inside a first opening of the metal layer, and is further disposed inside a second opening of the insulation layer.

The antenna device may further include a second feed via, configured to be connected to a bottom surface of the antenna body portion.

The second feed via and the metal layer may be separated from each other.

The second feed via may be disposed inside a second opening of the metal layer, and may be further disposed inside a third opening of the insulation layer.

Other features and aspects will be apparent from the following detailed description, the drawings, and the claims.

Figure 1:
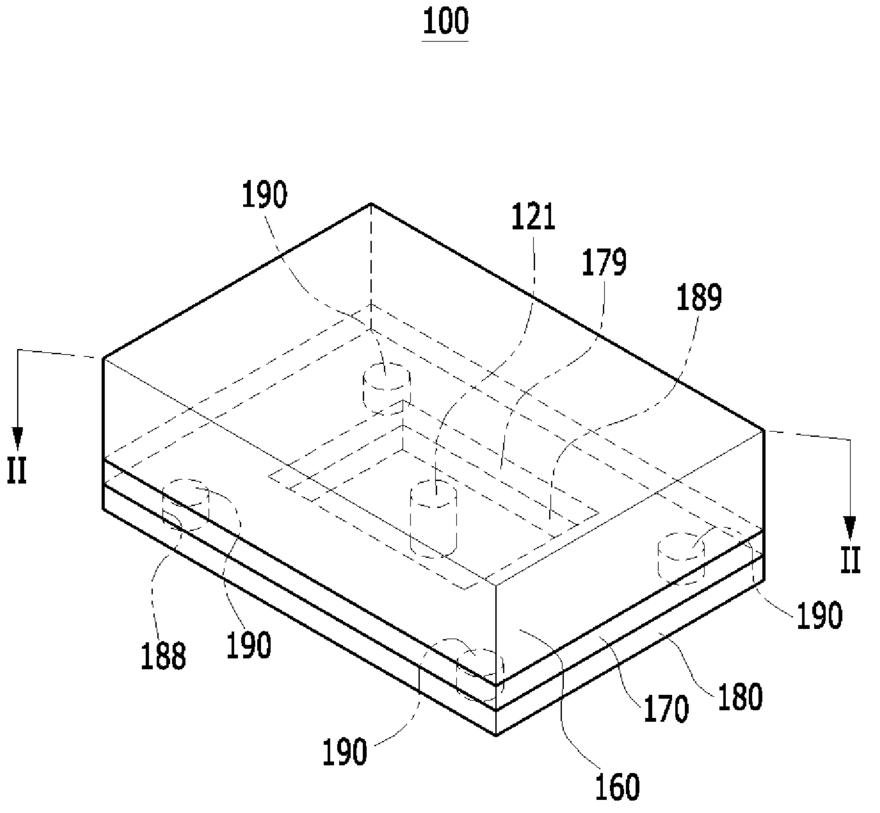
FIG. 1 is a schematic perspective view of an example antenna device, in accordance with one or more embodiments.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of this application may be omitted for increased clarity and conciseness, noting that omissions of features and their descriptions are also not intended to be admissions of their general knowledge.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

The size and thickness of each configuration shown in the drawings are arbitrarily shown for better understanding and ease of description, but the examples are not limited thereto. In the drawings, the thickness of layers, films, panels, regions, etc., are exaggerated for clarity. The thicknesses of some layers and areas are exaggerated for convenience of explanation.

It will be understood that when an element such as a layer, film, region, or substrate is referred to as being "on" another element, it can be directly on the other element or intervening elements may also be present. In contrast, when an element is referred to as being "directly on" another element, there are no intervening elements present. The word "on" or "above" means disposed on or below the object portion, and does not necessarily mean disposed on the upper side of the object portion based on a gravitational direction.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Unless otherwise defined, all terms, including technical and scientific terms, used herein have the same meaning as commonly understood by one of ordinary skill in the art to which this disclosure pertains and after an understanding of the disclosure of this application. Terms, such as those defined in commonly used dictionaries, are to be interpreted as having a meaning that is consistent with their meaning in the context of the relevant art and the disclosure of this application, and are not to be interpreted in an idealized or overly formal sense unless expressly so defined herein.

Throughout the description, when an element is referred to as being "above" another element, this includes not only the example where another element is "directly above", but also the example where there is another element in the middle. On the contrary, when an element is referred to as being "below" another element, this includes not only the example where the other element is "directly below", but also the example where there is another element in the middle.

Throughout the description, a pattern, a via, a plane, a line, and an electrical connection structure may include a metallic material (e.g., a conductive material such as copper (Cu), aluminum (Al), silver (Ag), tin (Sn), gold (Au), nickel (Ni), lead (Pb), titanium (Ti), or an alloy thereof), and may be formed according to a plating method such as chemical vapor deposition (CVD), physical vapor deposition (PVD), sputtering, a subtractive process, an additive process, a semi-additive process (SAP), a modified semi-additive process (MSAP), and the like, but this is not restrictive.

Throughout the specification, an RF signal includes Wi-Fi (IEEE 802.11 family, etc.), WiMAX (IEEE 802.16 family, etc.), IEEE 802.20, LTE (long term evolution), Ev-DO, HSPA, HSDPA, HSUPA, EDGE, GSM, GPS, GPRS, CDMA, TDMA, DECT, Bluetooth, 3G, 4G, 5G, and any other wireless and wired protocols designated thereafter, but is not limited thereto.

Example embodiments described herein provide an antenna that can be easily down-sized.

Example embodiments described herein may improve bonding strength between an antenna device and a printed circuit board.

Figure 2:
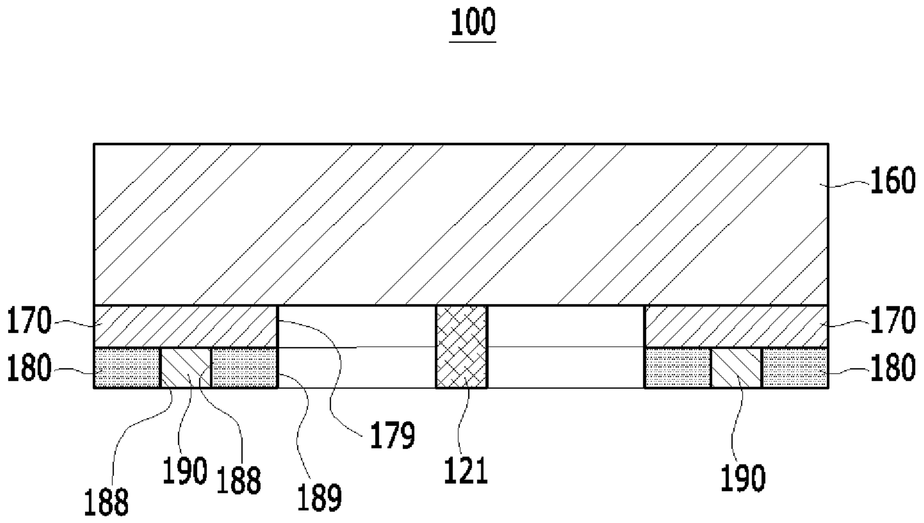
FIG. 2 is a cross-sectional view of FIG. 1 taken along the line II-II.
Figure 3:
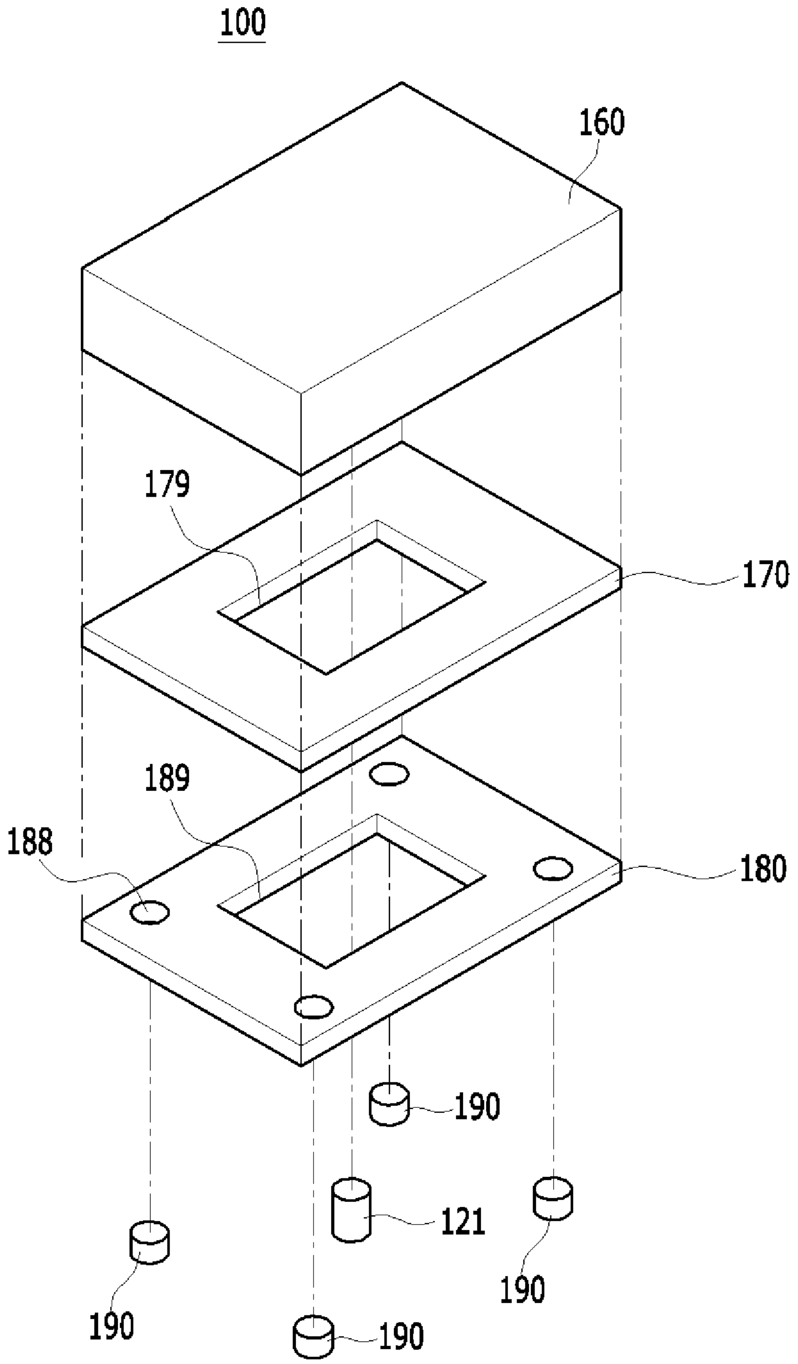
FIG. 3 is an exploded perspective view of the antenna of FIG. 1.

FIG. 1 is a schematic perspective view of an example antenna device, in accordance with one or more embodiments, FIG. 2 is a cross-sectional view of FIG. 1 taken along the line II-II, and FIG. 3 is an exploded perspective view of the example antenna of FIG. 1.

Referring to FIG. 1 to FIG. 3, an antenna device 100 includes an antenna body portion 160, a metal layer 170, a first insulation layer 180, a first feed via 121, and an electrical connection structure 190.

The antenna body portion 160 is formed of a dielectric material having a dielectric constant, and may transmit or receive an RF signal by resonating for an RF signal of a certain frequency bandwidth through power supply. The dielectric constant of the dielectric material that forms the antenna body portion 160 may be higher than a dielectric constant of the first insulation layer 180, and may be lower than a dielectric constant of the metal layer 170. Accordingly, since the antenna body portion 160 may have a higher dielectric constant than the antenna device implemented in a printed circuit board which has a low dielectric constant, the size of the antenna device can be reduced.

The dielectric constant of the dielectric material forming the antenna body portion 160 may be about 3 to about 35. When the dielectric constant of the dielectric material forming the antenna body portion 16 is higher than about 3, a gain of the antenna device 100 with respect to an RF signal of a low frequency bandwidth can be improved while downsizing the antenna device 100. Additionally, when the dielectric constant of the dielectric material that forms the antenna body portion 160 is lower than about 35, the antenna device 100 can resonate for an RF signal of a constant frequency bandwidth through power supply, and accordingly, a gain of the antenna device 100 for the RF signal can be improved. In an example, the antenna body portion 160 may include a ceramic material. Additionally, the antenna body portion 160 may include a material that forms the printed circuit board, and an inorganic filler such as alumina and the like.

The first feed via 121 may be electrically connected to the antenna body portion 160. Thus, the antenna body portion 160 can be fed with power through the first feed via 121. In an example, the first feed via 121 may provide direct feed or indirect feed by coupling feeding to the antenna body portion 160. At least a part of the first feed via 121 may be inserted into the antenna body portion 160, or may penetrate the antenna body portion 160, and accordingly, feeding efficiency to the antenna body portion 160 can be improved.

The metal layer 170 contacts the antenna body portion 160, and the metal layer 170 contacts the electrical connection structure 190. Accordingly, when the antenna device 100 is attached on the printed circuit board, adherence force of the metal layer 170 may be improved such that bonding strength between the antenna device 100 and the printed circuit board can be improved. However, when the electrical connection structure 190 contacts the antenna body portion 160 without the metal layer 170, bonding strength between the antenna device 100 and the printed circuit board may be weakened. In an example, due to use of the metal layer 170, the bonding strength between the antenna device 100 and the printed circuit board may be improved from about 5 N to about 42 N, or from about 10.4 N to about 33.2 N.

Additionally, since the antenna body portion 160 is blocked by the metal layer 170, the metal layer 170 may serve as a ground, and accordingly, directivity of the antenna device 100 can be improved. Additionally, in a subsequent process of manufacturing the antenna module using the antenna device 100, the antenna module can be manufactured without changing the performance of the antenna.

The area where the metal layer 170 and the antenna body portion 160 contact may be about 10% or more of the area of the bottom surface of the antenna body portion 160, which is smaller than a value excluding the flat area of the first feed via 121 in the area of the bottom surface of the antenna body portion 160. When the contact area of the metal layer 170 and the antenna body portion 160 with respect to the area of the bottom surface of the antenna body portion 160 is about 10% or more, the antenna device 100 may not be removed from the printed circuit board, and since it is easy to pattern the metal layer 170, a defect rate may be reduced, and the directivity of the antenna device 100 may be improved by the ground function of the metal layer 170. Additionally, when the contact area of the metal layer 170 and the antenna body portion 160 is smaller than the value excluding the flat area of the first feed via 121 in the area of the bottom surface of the antenna body portion 160, a short may not occur in the antenna device 100.

In an example, the metal layer 170 may be printed to the bottom surface of the antenna body portion 160. Alternatively, after the metal layer 170 is deposited to the bottom surface of the antenna body portion 160, an opening 179 may be formed through an etching process. Accordingly, the metal layer 170 may include the opening 179 that exposes the antenna body portion 160 and the first feed via 121. The first feed via 121 located inside the opening 179 may be separated from the metal layer 170, and accordingly, a short between the first feed via 121 and the metal layer 170 can be prevented. The metal layer 170 may be selectively subjected to a sintering process.

In an example, the metal layer 170 may include at least one of metals such as Cu, Ti, Pt, Mo, W, Fe, Ag, Au, Cr, and the like. Additionally, the metal layer 170 may further include glass, and thus, the bonding strength between the antenna device 100 and the printed circuit board can be improved. In an example, the metal layer 170 may contain more than 0 wt % and less than or equal to about 5 wt % of glass based on the weight of the entire metal layer 170. When the metal layer 170 contains more than 0 wt % of glass, the bonding strength between the antenna device 100 and the printed circuit board may be further improved due to the increase in the bonding force of the glass in the metal layer 170. Additionally, when the metal layer 170 contains less than or equal to about 5 wt % of glass, the ground function of the metal layer 170 is maintained, thereby maintaining the directivity of the antenna device 100.

The electrical connection structure 190 may have a structure such as a solder ball, a pin, a land, a pad, and the like, but is not limited thereto. The shape and number of electrical connection structures 190 are not particularly limited.

The first insulation layer 180 may cover at least a part of the metal layer 170. The first insulation layer 180 may prevent removal due to a difference in height between terminals. Further, since the first insulation layer 180 may cover the metal layer 170, a defect due to a short between the metal layer 170 and the first feed via 121 can be reduced.

In an example, the first insulation layer 180 may be printed to the bottom surface of the metal layer 170. Alternatively, after the first insulation layer 180 is deposited to the bottom surface of the metal layer 170, openings 188 and 189 may be formed through an etching process. Accordingly, the first insulation layer 180 may include the opening 188 that exposes the bottom surface of the metal layer 170, and the electrical connection structure 190 may be positioned inside the opening 188. The first insulation layer 180 contacts a side surface of the electrical connection structure 190 at a side of the opening 188, and accordingly, the bonding strength between the antenna device 100 and the printed circuit board can be improved. Additionally, the first insulation layer 180 may include the opening 189 that exposes the antenna body portion 160. The first insulation layer 180 may be selectively subjected to a sintering process.

In an example, the first insulation layer 180 may be implemented as a thermosetting resin such as FR4, a liquid crystal polymer (LCP), a low temperature co-fired ceramic (LTCC), and an epoxy resin, a thermoplastic resins such as polyimide, a resin impregnated in core materials such as glass fiber (glass fiber, glass cloth, glass fabric) with an inorganic filler, prepreg, an Ajinomoto build-up film (ABF), FR-4, bismaleimide triazine (BT), a photoimageable dielectric (PID) resin, a copper clad laminate (CCL), or a glass or ceramic-based insulator.

A planar shape of the metal layer 170 may overlap at least a part of the bottom edge of the antenna body portion 160, and a planar shape of the first insulation layer 180 may overlap at least a part of the bottom edge of the metal layer 170.

Figure 4:
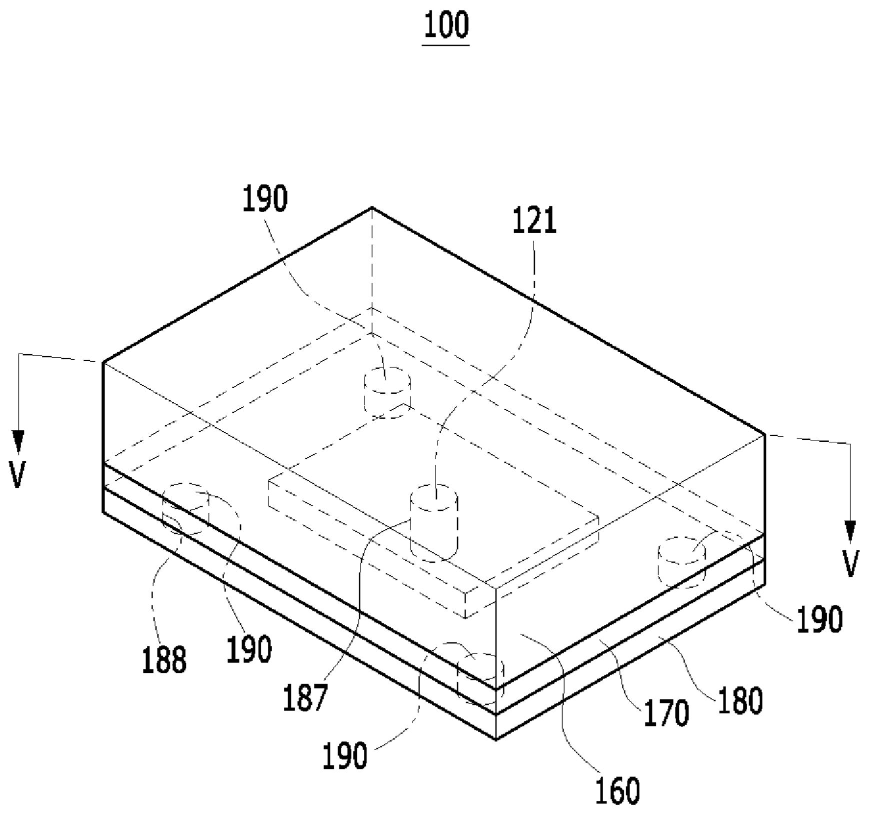
FIG. 4 is a schematic perspective view of an example antenna device, in accordance with one or more embodiments.
Figure 5:
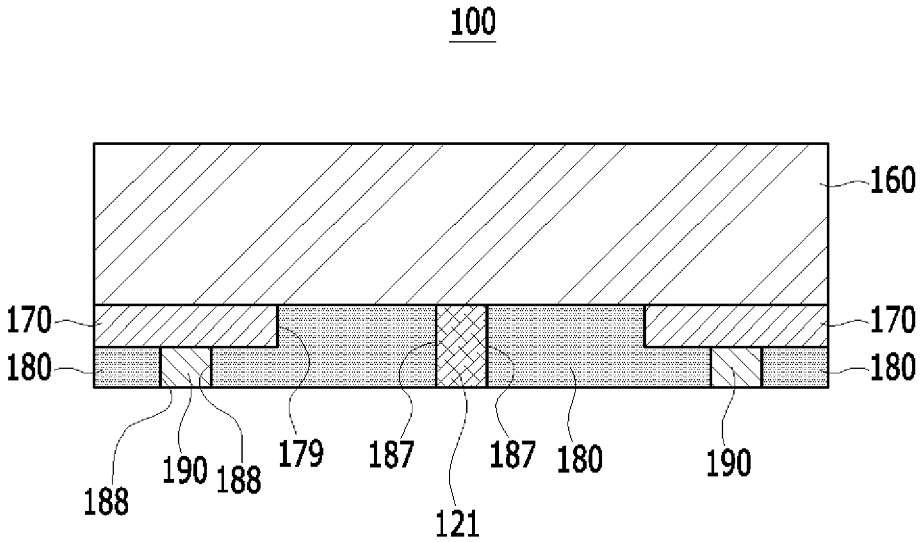
FIG. 5 is a cross-sectional view of FIG. 4 taken along the line V-V.
Figure 6:
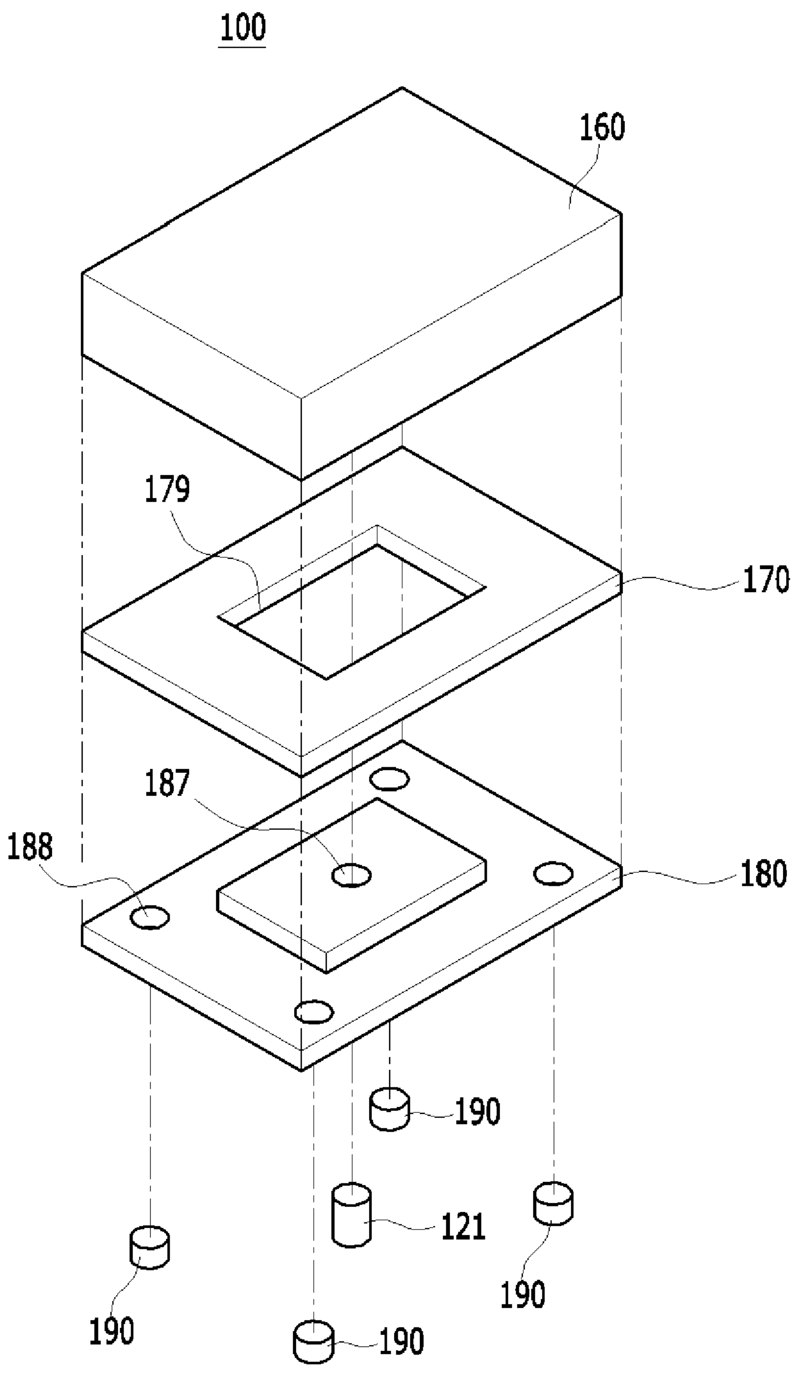
FIG. 6 is an exploded perspective view of the example antenna device of FIG. 4.

FIG. 4 is a schematic perspective view of an example antenna device, in accordance with one or more embodiments, FIG. 5 is a cross-sectional view of FIG. 4 taken along the line V-V, and FIG. 6 is an exploded perspective view of the example antenna device of FIG. 4.

Referring to FIG. 4 to FIG. 6, an example antenna device 100 includes an antenna body portion 160, a metal layer 170, a first insulation layer 180, a first feed via 121, and an electrical connection structure 190. Among the configurations of the antenna device 100 of FIG. 4 to FIG. 6, the above-stated description of the antenna device 100 of FIG. 1 to FIG. 3 is applied to the configurations overlapping with the antenna device 100 of FIG. 1 to FIG. 3.

The first insulation layer 180 may cover at least a part of the metal layer 170. The first insulation layer 180 may prevent removal due to a difference in height between terminals. Additionally, since the first insulation layer 180 surrounds the first feed via 121, a defect due to a short between the metal layer 170 and the first feed via 121 can be more reduced.

In an example, the first insulation layer 180 may be printed to the bottom surface of the metal layer 170. Alternatively, after the first insulation layer 180 is deposited to the bottom surface of the metal layer 170, openings 187 and 188 may be formed through an etching process. Accordingly, the first insulation layer 180 may include the one or more openings 188 that expose at least portions of the bottom surface of the metal layer 170, and the electrical connection structure 190 may be positioned inside the one or more openings 188. Additionally, the first insulation layer 180 may include the opening 187 that exposes at least a portion of the antenna body portion 160, and the first feed via 121 may be positioned inside the opening 187. The first insulation layer 180 may be selectively subjected to a sintering process.

Figure 7A:
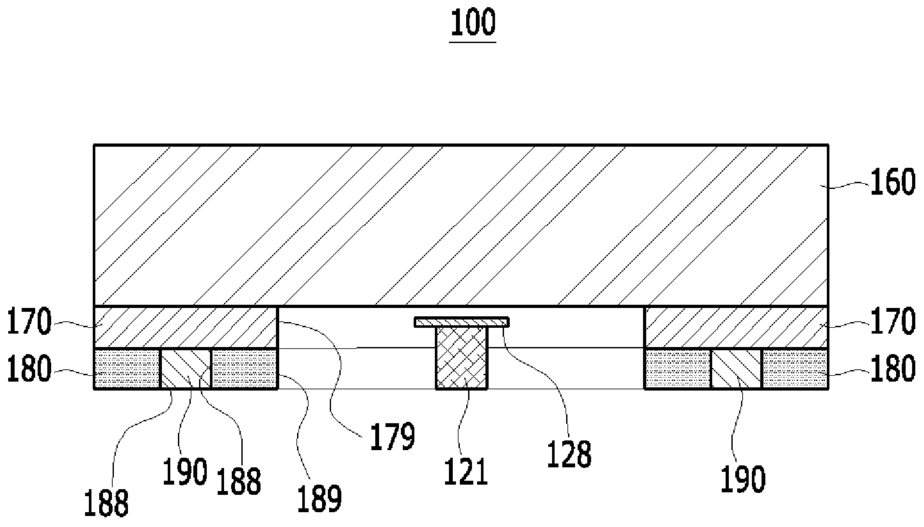
FIG. 7A is a schematic cross-sectional view of an example antenna device, in accordance with one or more embodiments.

FIG. 7A is a schematic cross-sectional view of an example antenna device, in accordance with one or more embodiments.

Referring to FIG. 7A, an antenna device 100 includes an antenna body portion 160, a metal layer 170, a first insulation layer 180, a first feed via 121, a feed pattern 128, and an electrical connection structure 190. Among the configurations of the antenna device 100 of FIG. 7A, the above-stated description of the antenna device 100 of FIG. 1 to FIG. 3 is applied to the configurations overlapping with the antenna device 100 of FIG. 1 to FIG. 3.

The feed pattern 128 may be connected to one end of the first feed via 121. The feed pattern 128 extends substantially in parallel with the antenna body portion 160, and may have various planar shapes such as a polygon, a circle, and the like. Based on the feed pattern 128, the antenna body portion 160 can be fed by coupling feeding.

Figure 7B:
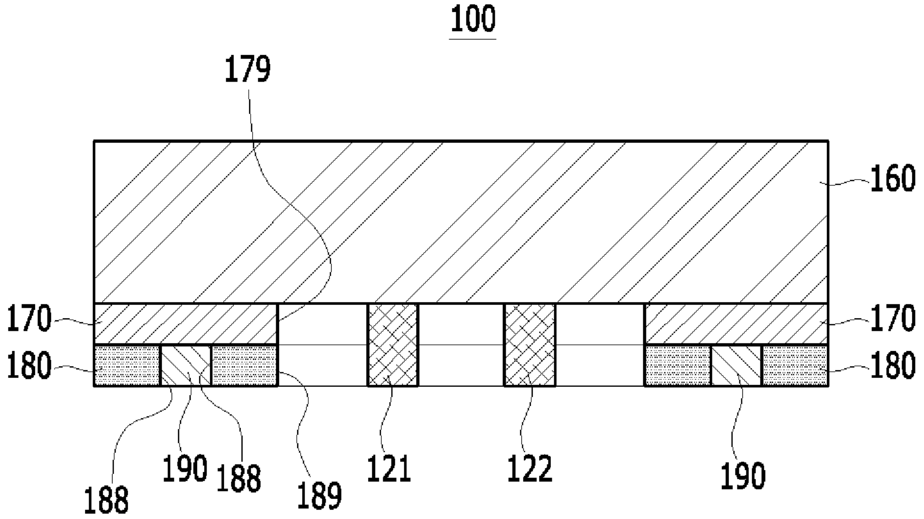
FIG. 7B is a schematic cross-sectional view of an example antenna device, in accordance with one or more embodiments.

FIG. 7B is a schematic cross-sectional view of an example antenna device, in accordance with one or more embodiments.

Referring to FIG. 7B, the antenna device 100 includes an antenna body portion 160, a metal layer 170, a first insulation layer 180, a first feed via 121, a second feed via 122, and an electrical connection structure 190. Among the configurations of the antenna device 100 of FIG. 7, the above-stated description of the antenna device 100 of FIG. 1 to FIG. 3 is applied to the configurations overlapping with the antenna device 100 of FIG. 1 to FIG. 3.

The first feed via 121 and the second feed via 122 are electrically connected to the antenna body portion 160. Accordingly, the antenna body portion 160 may be fed through the first feed via 121 and the second feed via 122. In an example, the first feed via 121 may provide direct feeding to the antenna body portion 160 or indirect feeding by coupling feeding. Additionally, the second feed via 122 may provide direct feeding to the antenna body portion 160 or indirect feeding by coupling feeding. At least a part of the first feed via 121 and at least a part of the second feed via 122 may be inserted into, or may penetrate, the antenna body portion 160, and accordingly, efficiency of feeding to the antenna body portion 160 can be improved.

The first feed via 121 and the second feed via 122 may transmit and/or receive a plurality of polarizations having different phases, respectively. The first feed via 121 and the second feed via 122 allow a first RF signal and a second RF signal that are polarized to each other to pass.

The antenna body portion 160 may transmit and/or receive a plurality of RF signals, and the plurality of RF signals may be a plurality of carrier signals carrying different data. Accordingly, the data transmitting and/or receiving rate of the antenna body portion 160 may be improved by 2 times according to the transmitting and/or receiving of the plurality of RF signals.

In an example, since the first RF signal and the second RF signal have different phases (e.g., 90 degrees or 180 degrees), thereby reducing interference with each other.

In an example, the first RF signal and the second RF signal may be perpendicular to a propagation direction (e.g., a z direction) and may form an electric field and a magnetic field with respect to the x direction and the y direction, which are perpendicular to each other, and the first RF signal and the second RF signal can implement polarization between RF signals by forming the magnetic field and the electric field for the x direction and the y direction, respectively. In the antenna body portion 16, a surface current corresponding to the first RF signal and a surface current corresponding to the second RF signal may flow to be perpendicular to each other.

Figure 8:
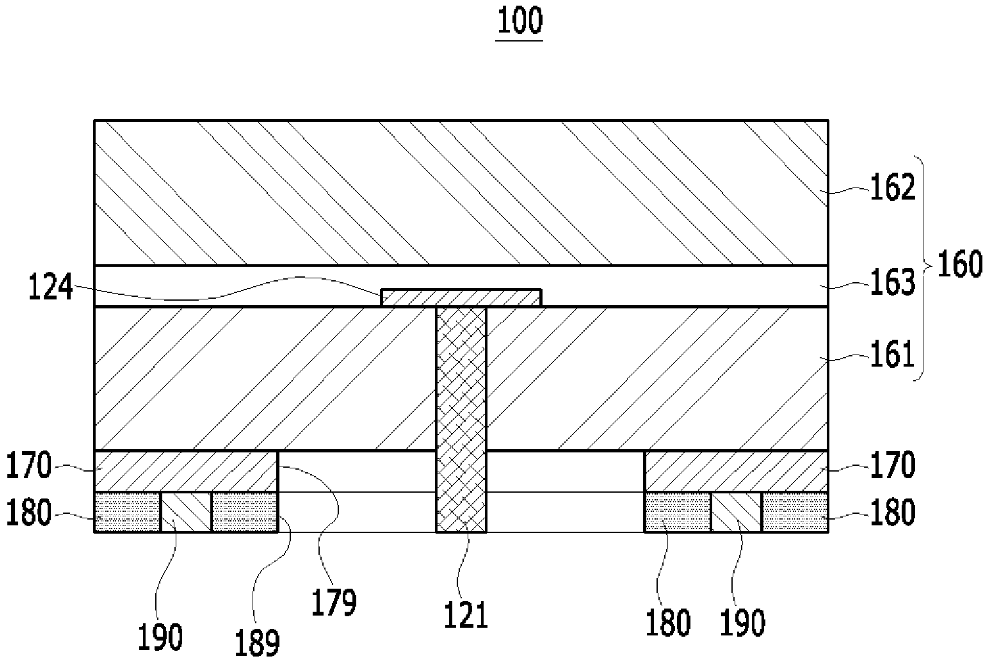
FIG. 8 is a schematic cross-sectional view of an example antenna device, in accordance with one or more embodiments.

FIG. 8 is a schematic cross-sectional view of an example antenna device, in accordance with one or more embodiments.

Referring to FIG. 8, an antenna device 100 includes an antenna body portion 160, a metal layer 170, a first insulation layer 180, a first feed via 121, and an electrical connection structure 190. Among the configurations of the antenna device 100 of FIG. 8, the above-stated description of the antenna device 100 of FIG. 1 to FIG. 3 is applied to the configurations overlapping with the antenna device 100 of FIG. 1 to FIG. 3.

The antenna body portion 160 includes a first dielectric material block 161, a polymer layer 163 disposed on the first dielectric material block 161, and a second dielectric material block 162 disposed on the polymer layer 163. Due to a structure of the antenna body portion 160, a bandwidth can be expanded and a gain can be improved. In an example, when only the first dielectric block 161 is provided, a single resonance may occur in the vicinity of about 35 GHz, and a maximum gain at a boresight may be about 2 dB. However, in the example of the antenna body portion 160 of FIG. 8, a double resonance may occur in the vicinity of about 27 GHz and about 31 GHz, and the maximum gain at the boresight may be about 5 dB.

The first dielectric material block 161 and the second dielectric material block 162 may respectively have rectangular shapes of the same planar shapes, and may be at least partially overlapped with each other in a planar view.

The first dielectric material block 161 and the second dielectric material block 162 are respectively formed of dielectric materials having a dielectric constant, and may resonate for an RF signal of a constant frequency bandwidth through a feed process, and may thus transmit and/or receive the RF signal. The dielectric constant of the first dielectric material block 161 may be larger than the dielectric constant of the first insulation layer 180, and may be smaller than the dielectric constant of the metal layer 170. The dielectric constant of the second dielectric material block 162 may be larger than the dielectric constant of the first insulation layer 180, and may be smaller than the dielectric constant of the metal layer 170. Accordingly, since the antenna body portion 160 has a higher dielectric constant than the antenna device implemented in a printed circuit board having a low dielectric constant, the size of the antenna device can be reduced.

The dielectric constant of the dielectric material forming the first dielectric material block 161 may be about 3 to about 35, and the dielectric constant of the dielectric material forming the second dielectric material block 162 may be about 3 to about 35. When the dielectric constant of the dielectric material forming the first dielectric material block 161 or the second dielectric material block 162 is larger than about 4, a gain of the antenna device 100 with respect to an FR signal of a low frequency bandwidth can be improved while maintaining down-sizing of the antenna device 100. Additionally, when the dielectric constant of the dielectric material forming the first dielectric material block 161 or the second dielectric material block 162 is smaller than about 35, the antenna device 100 can resonate for an RF signal of a constant frequency bandwidth through the power supply, and accordingly, a gain of the antenna device 100 for the RF signal can be improved. In an example, the first dielectric material block 161 or the second dielectric material block 162 may include a ceramic material. Additionally, the first dielectric material block 161 or the second dielectric material block 162 may include a material that forms the printed circuit board, and an inorganic filler such as alumina and the like.

For the first dielectric material block 161 and the second dielectric material block 162, a resonance frequency may be determined based on a volume and a dielectric constant, respectively. Accordingly, it is possible to down-size the antenna device 100 by utilizing the dielectric constant and area of the material that forms each of the first dielectric material block 161 and the second dielectric material block 162. The dielectric constants of the first dielectric material block 161 and the second dielectric material block 162 may be the same as, or different from, each other.

The polymer layer 163 is disposed between the first dielectric material block 161 and the second dielectric material block 162, and may bond the respective dielectric material blocks 161 and 162. The polymer layer 163 may include at least one of a polyimide-based polymer, a poly (methyl methacrylate)-based polymer, a polytetrafluoroethylene-based polymer, a polyphenylene ether-based polymer, a benzocyclobutene-based polymer, and a liquid crystal polymer. A dielectric constant of the polymer layer 163 may be smaller than a dielectric constant of the first dielectric material block 161, and may be smaller than that a dielectric constant of the second dielectric material block 162.

The antenna device 100 may include a first metal patch 124 that is selectively located on the top surface of the first dielectric material block 161. The first metal patch 124 is located in the bottom surface of the polymer layer 163. The first metal patch 124 may be electrically connected with the first feed via 121, and accordingly, feed efficiency can be further increased. The first metal patch 124 may have planes of various shapes such as polygons and circles in various sizes. By changing the size and shape of the first metal patch 124, the design freedom of the antenna device 100 can be improved by combining it with the first feed via 121.

Figure 9:
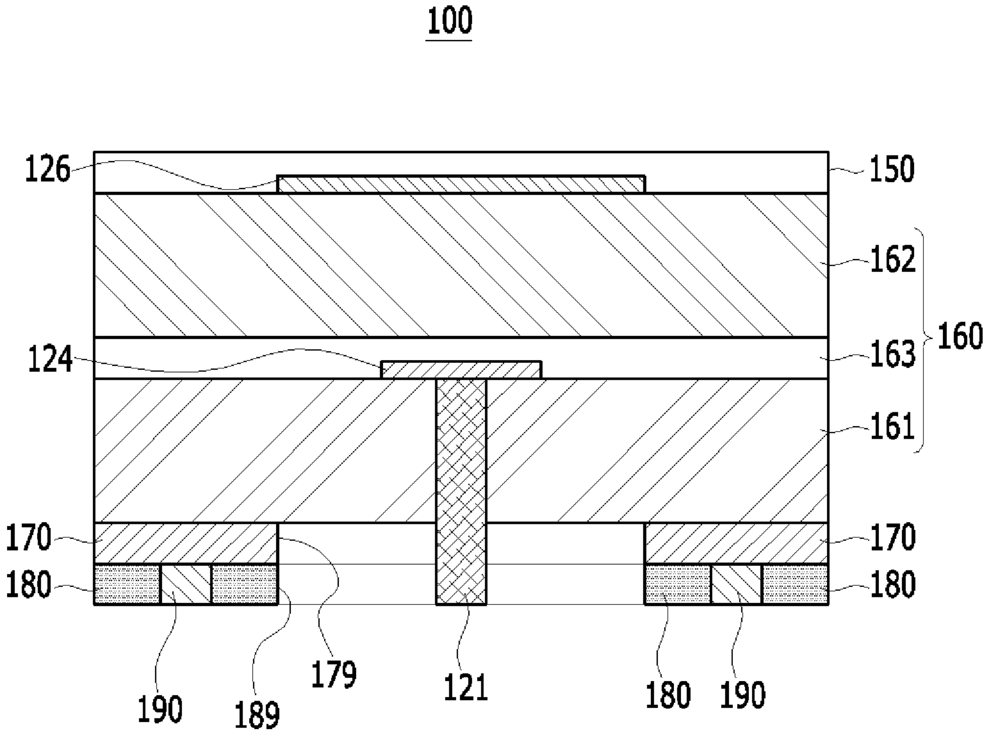
FIG. 9 is a schematic cross-sectional view of an example antenna device, in accordance with one or more embodiments.

FIG. 9 is a schematic cross-sectional view of an example antenna device, in accordance with one or more embodiments.

Referring to FIG. 9, an antenna device 100 includes an antenna body portion 160, a metal layer 170, a first insulation layer 180, a first feed via 121, and an electrical connection structure 190. Among the configurations of antenna device 100 of FIG. 9, the above-stated description of the antenna device 100 of FIG. 1 to FIG. 3 is applied to the configurations overlapping with the antenna device 100 of FIG. 1 to FIG. 3.

The antenna device 100 may include a second metal patch 126 that is selectively disposed on the top surface of the second dielectric material block 162. The second metal patch 126 is coupled with the first metal patch 124, and accordingly, a gain of an RF signal transmitted and/or received through the first feed via 121 can be improved. The second metal patch 126 may have planes of various shapes such as polygons and circles in various sizes. By changing the size and shape of the second metal patch 126, the design freedom of the antenna device 100 can be improved by combining it with the first feed via 121 and the second metal patch 126.

The antenna device 100 may include a second insulation layer 150 that is selectively disposed on the second metal patch 126. In a process that manufactures an antenna module by using the antenna device 100, the second insulation layer 150 covers the second metal patch 126, and occurrence of scratches on the second metal patch 126 can be reduced, and accordingly, the performance of the antenna device 100 can be maintained.

In an example, the second insulation layer 150 may be implemented as a thermosetting resin such as FR4, a liquid crystal polymer (LCP), a low temperature co-fired ceramic (LTCC), and an epoxy resin, a thermoplastic resins such as polyimide, a resin impregnated in core materials such as glass fiber (glass fiber, glass cloth, glass fabric) with an inorganic filler, a prepreg, an Ajinomoto build-up film (ABF), FR-4, bismaleimide triazine (BT), a photoimageable dielectric (PID) resin, a copper clad laminate (CCL), or a glass or ceramic-based insulator.

Figure 10:
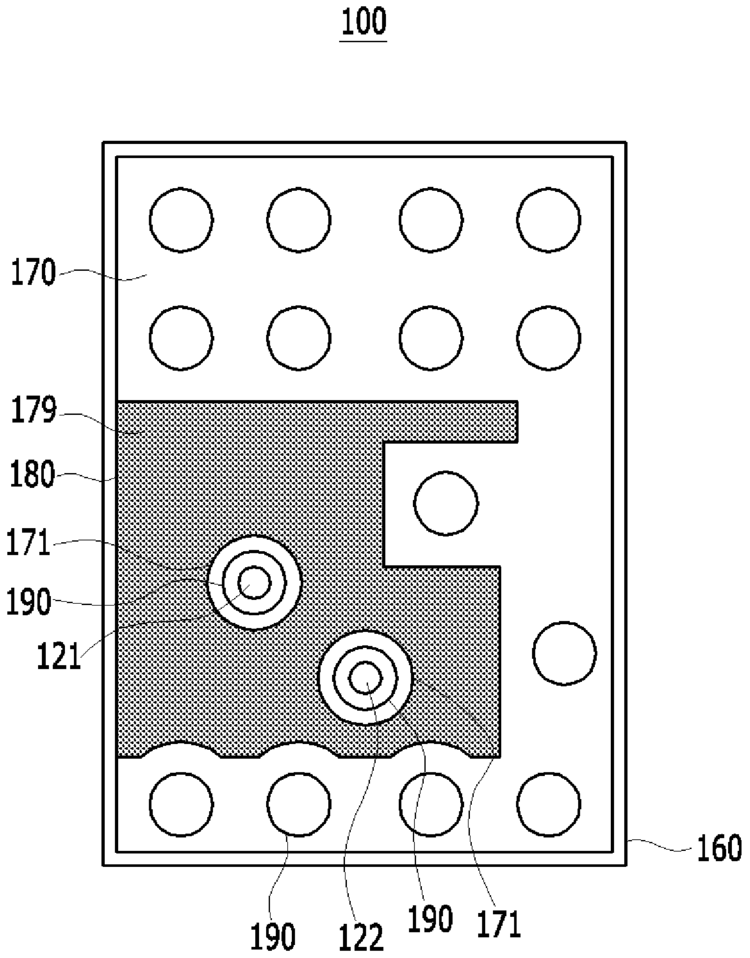
FIG. 10 is a schematic bottom view of an example antenna device, in accordance with one or more embodiments.

FIG. 10 is a schematic bottom view of an example antenna device, in accordance with one or more embodiments.

Referring to FIG. 10, an antenna device 100 include an antenna body portion 160, a metal layer 170, a first insulation layer 180, a first feed via 121, a second feed via 122, and an electrical connection structure 190. Among the configurations of the antenna device 100 of FIG. 10, the above-stated description of the antenna device 100 of FIG. 1 to FIG. 3 is applied to the configurations overlapping with the antenna device 100 of FIG. 1 to FIG. 3.

In the antenna device 100, the metal layer 170 may have various shapes and flat areas, and the electrical connection structure 190 may also have various numbers and alignments. FIG. 10 illustrates examples of the metal layer 170 and the electrical connection structure 190.

Referring to FIG. 10, in order to secure the minimum adhesive force of the antenna device 100, a plurality of electrical connection structures 190 may be disposed to occupy the largest area. Additionally, the metal layer 100 may overlap the plurality of electrical connection structures 190 in a plan view to improve the adhesive force of the antenna device 100. However, in such an example, the metal layer 170 covers the antenna body portion 160 within the limit of maintaining the antenna performance, and may include an opening 179 having a shape in which the patterning process can be easily performed. Additionally, the metal layer 170 may be disposed apart from the first feed via 121 to prevent a short of the antenna device 100, and the metal layer 170 may not be formed in an edge at the left side of the first feed via 121 among edges of the antenna body portion 160.

The first insulation layer 180 may cover the metal layer 170, excluding the plurality of electrical connection structures 190, and may also cover the opening 179 of the metal layer 170, excluding the plurality of electrical connection structures 190. Accordingly, each of the plurality of electrical connection structures 190 may contact the metal layer 170 or a metal pad 171 through openings formed in the first insulation layer 180.

The antenna device 100 may selectively include the metal pad 171. The metal pad 171 may be disposed on the same layer as the metal layer 170, and may connect the first feed via 121 and the second feed via 122 respectively to the electrical connection structures 190. A process error may occur during alignment in the manufacturing of a multi-layered antenna device 100, and as the metal pad 171 has a wider width than the first feed via 121 or the second feed via 122, occurrence of a short can be prevented.

Figure 11:
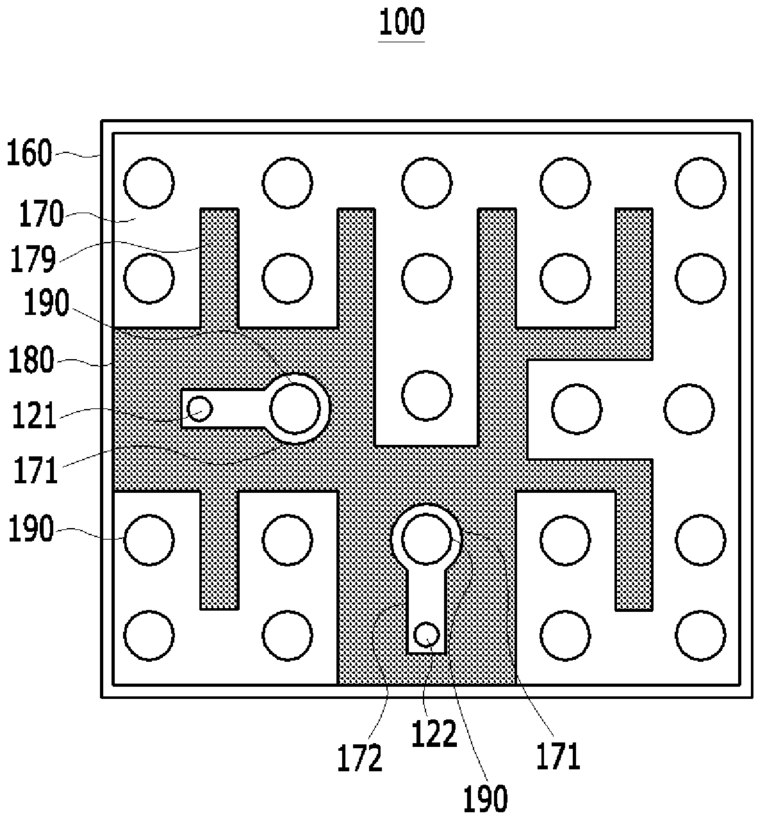
FIG. 11 is a schematic bottom view of an example antenna device, in accordance with one or more embodiments.

FIG. 11 is a schematic bottom view of an example antenna device, in accordance with one or more embodiments.

Referring to FIG. 11, an example antenna device 100 includes an antenna body portion 160, a metal layer 170, a first insulation layer 180, a first feed via 121, a second feed via 122, and an electrical connection structure 190. Among the configurations of the antenna device 100 of FIG. 11, the above-stated description of the antenna device 100 of FIG. 1 to FIG. 3 is applied to the configurations overlapping with the antenna device 100 of FIG. 1 to FIG. 3.

In the antenna device 100, the metal layer 170 may have various shapes and flat areas, and the electrical connection structure 190 may also have various numbers and alignments. FIG. 11 shows examples of the metal layer 170 and the electrical connection structure 190. In an example, a planar shape of the metal layer 170 may overlap at least a part of the edges of the antenna body portion 160, and a planar shape of the first insulation layer 180 may overlap at least a part of the edges of the metal layer 170.

Referring to FIG. 11, in order to secure the minimum adhesive force of the antenna device 100, a plurality of electrical connection structures 190 may be disposed to occupy the largest area. Additionally, the metal layer 100 may overlap the plurality of electrical connection structures 190 in a plan view to improve the adhesive force of the antenna device 100. However, in such an example, the metal layer 170 may cover the antenna body portion 160 within the limit of maintaining the antenna performance, and may include an opening 179 having a shape in which the patterning process can be easily performed. Additionally, the metal layer 170 may be disposed apart from the first feed via 121 to prevent a short of the antenna device 100, and the metal layer 170 may not be formed in an edge at the left side of the first feed via 121 and an edge below the second feed via 122 among the edges of the antenna body portion 160.

The first insulation layer 180 may cover the metal layer 170, excluding the plurality of electrical connection structures 190, and may also cover the opening 179 of the metal layer 170, excluding the plurality of electrical connection structures 190. Accordingly, each of the plurality of electrical connection structures 190 may contact the metal layer 170 or a metal pad 171 through openings formed in the first insulation layer 180.

The antenna device 100 may selectively include the metal pad 171. The metal pad 171 may be disposed on the same layer as the metal layer 170, and may be connected to the electrical connection structure 190. A process error may occur during alignment in the manufacturing of a multi-layered antenna device 100, and as the metal pad 171 has a wider width than the first feed via 121 or the second feed via 122, occurrence of a short can be prevented.

The antenna device 100 may selectively include a stripe pattern 172. The stripe pattern 172 may be disposed on the same layer as the metal layer 170, and may connect the first feed via 121 and the second feed via 122 respectively to metal pads 171. The stripe pattern 172 may extend away from the first feed via 121 or the second feed via 122. An electrical length of a path fed to the antenna body portion 160 can be adjusted through the strip pattern 172, thereby increasing the degree of freedom for impedance matching and improving a gain of the antenna device 100.

Figure 12:
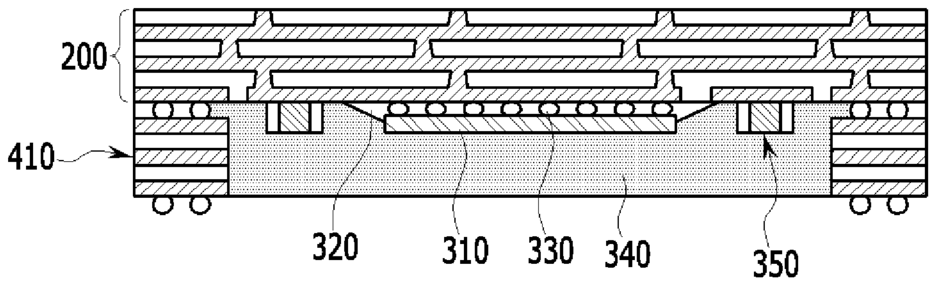
FIG. 12 is a schematic side view of a structure of a lower portion of an example antenna device, in accordance with one or more embodiments.

FIG. 12 is a schematic side view of a structure of a lower portion of an example antenna device, in accordance with one or more embodiments.

Referring to FIG. 12, an example antenna device may include at least a part of a connection member 200, an IC 310, an adhesive member 320, an electrical connection structure 330, an encapsulation member 340, a manual part or passive element 350, and a core member 410.

The connection member 200 may have a structure in which a plurality of metal layers having a pre-designed pattern such as a printed circuit board (PCB), and a plurality of insulation layers are stacked.

The IC 310 may be disposed in a lower side of the connection member 200. The IC 310 is connected to a wire of the connection member 200 and thus may transmit or receive an RF signal, and may receive a ground by being connected to a ground plane of the connection member 200. In an example, the IC 310 may generate a converted signal by performing at least some of frequency conversion, amplification, filtering, phase control, and power generation.

The adhesive member 320 may the bond IC 310 and the connection member 200 to each other.

The electrical connection structure 330 may connect the IC 310 and the connection member 200. In an example, the electrical connection structure 330 may have structures such as, but not limited to, solder balls, pins, lands, and pads. The electrical connection structure 330 may have a lower melting point than the wiring of the connection member 200 and the ground plane, and thus the IC 310 and the connection member 200 can be connected through a predetermined process using such a lower melting point.

The encapsulation member 340 may encapsulate at least a part of the IC 310, and may improve heat dissipation performance and impact protection performance of the IC 310. For example, the encapsulation member 340 may be implemented as a photoimageable encapsulant (PIE), an Ajinomoto build-up film (ABF), an epoxy molding compound (EMC), and the like.

The passive element 350 may be disposed on the bottom surface of the connection member 200, and may be connected to the wire of the connection member 200 and/or a ground plane. In an example, the passive element 350 may include at least one of, but not limited to, a capacitor (e.g., a multi-layer ceramic capacitor (MLCC)), an inductor, and a chip resistor.

The core member 410 may be disposed in a lower side of the connection member 200, and may be connected to the connection member 200 so as to receive an intermediate frequency (IF) signal or a baseband signal from an external source, and transmit the received signal to the IC 310, or to receive an IF signal or a baseband signal from the IC 310 and transmit the received signal to an external source. In an example, a frequency (e.g., 24 GHz, 28 GHz, 36 GHz, 39 GHz, or 60 GHz) of the RF signal is higher than a frequency (e.g., 2 GHz, 5 GHz, 10 GHz, and the like) of the IF signal.

In an example, the core member 410 may transmit an IF signal or a baseband signal to the IC 310 or receive an IF signal from the IC 310 through a wire that can be included in the IC ground plane of the connection member 200. Since the ground plane of the connection member 200 is disposed between the IC ground plane and the wire, the IF signal or baseband signal and the RF signal can be electrically separated from each other in the antenna device.

Figure 13:
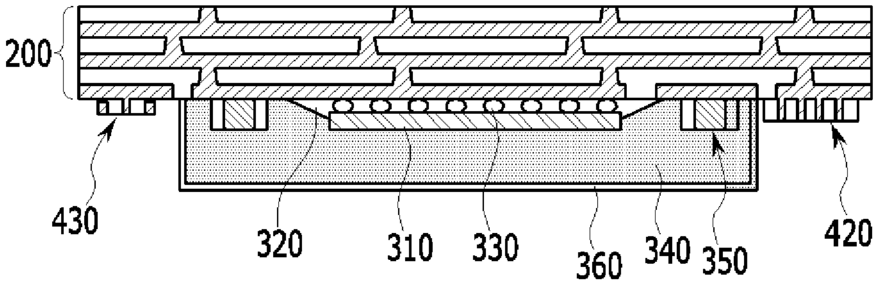
FIG. 13 is a schematic side view of a structure of a lower side of an example antenna device, in accordance with one or more embodiments.

FIG. 13 is a schematic side view of a structure of a lower side of an example antenna device, in accordance with one or more embodiments.

Referring to FIG. 13, an example antenna device may include at least one of a shield member 360, a connector 420, and a chip antenna 430.

The shield member 360 may be disposed in a lower side of the connection member 200 to confine the IC 310 and the encapsulation member 340 along with the connection member 200. In an example, the shield member 360 may be disposed for conformal shielding of all the IC 310, the manual part 350, and the encapsulation member 340 or compartment shielding of each of the C 310, the manual part 350, and the encapsulation member 340. In an example, the shield member 360 may have a shape of a hexahedron with one open side, and may have a hexahedral receiving space for combination with the connection member 200. The shield member 360 may have a short skin depth because it may be implemented with a material of high conductivity, such as copper, and may be connected to a ground plane of the connection member 200. Therefore, the shield member 360 can reduce electromagnetic noise that the IC 310 and the manual part 350 may receive. However, the encapsulation member 340 may be omitted depending on the design.

The connector 420 may have a connection structure of a cable (e.g., a coaxial cable, a flexible PCB, and the like), may be connected to the IC ground plane of the connection member 200, and may play a similar role to a sub-board. The connector 420 may receive an IF signal, a baseband signal, and/or power from a cable, or may provide an IF signal and/or a baseband signal through a cable.

In an example, the chip antenna 430 may transmit and/or receive an RF signal in support of the antenna device. In an example, the chip antenna 430 may include a dielectric block having a larger dielectric constant than an insulation layer, and a plurality of electrodes disposed at opposite sides of the dielectric block. One of the plurality of electrodes may be connected to a wire of the connection member 200, and the other may be connected to the ground plane of the connection member 200.

Figure 14:
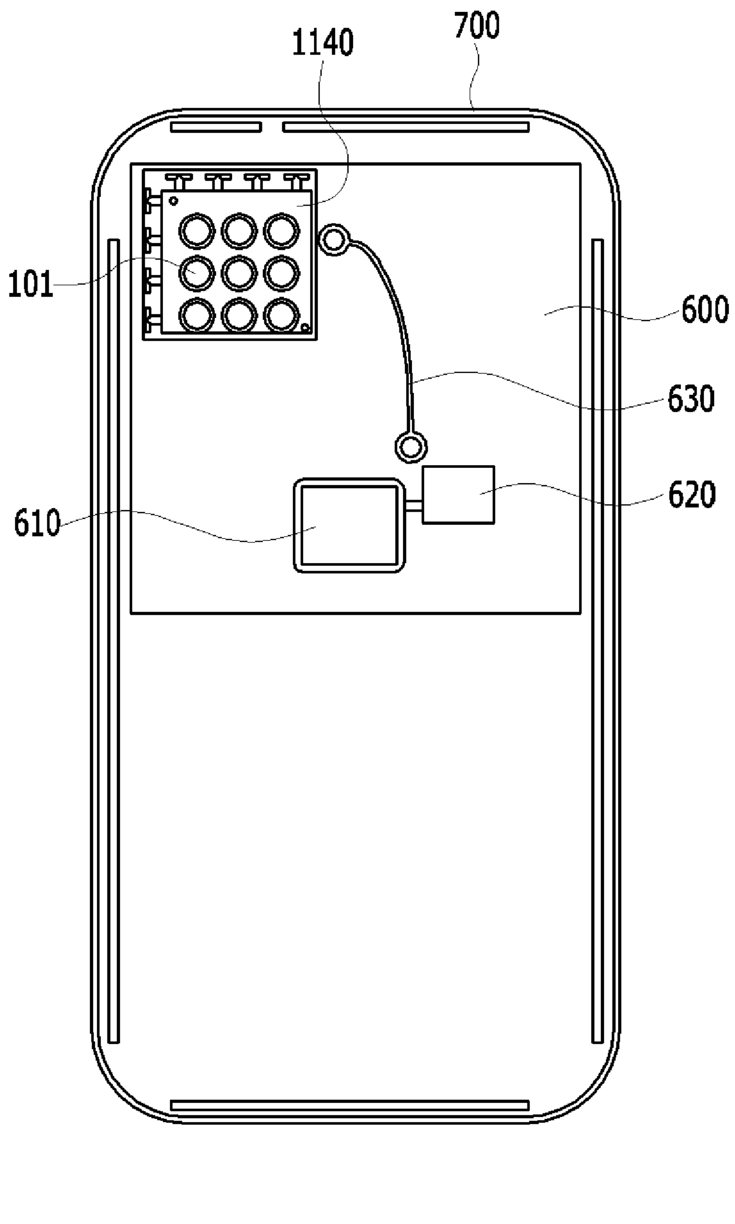
FIG. 14 is a top plan view that illustrates an alignment of an example antenna device in an example electronic device, in accordance with one or more embodiments.

FIG. 14 is a top plan view that illustrates an alignment of an example antenna device in an example electronic device, in accordance with one or more embodiments.

Referring to FIG. 14, an example antenna device includes an antenna pattern 101 that may be disposed adjacent to a side boundary of an electronic device 700 on a set substrate 600 of the electronic device 700.

The electronic device 700 may be, as non-limited examples, a smart phone, a personal digital assistant, a digital video camera, a digital still camera, a network system, a computer, a monitor, a tablet, a laptop, a netbook, a television, a video game, a smart watch, an automotive part, and the like, but this is not restrictive.

A communication module 610 and a baseband circuit 620 may be further disposed on the set substrate 600. The antenna device may be connected to the communication module 610 and/or the baseband circuit 620 through a coaxial cable 630.

The communication module 610 includes: a memory chip such as a volatile memory (e.g., DRAM), a non-volatile memory (e.g., ROM), and a flash memory to perform digital signal processing; an application processor chip such as a central processor (e.g., CPU), a graphics processor (e.g., GPU), a digital signal processor, an encryption processor, a microprocessor, and a micro controller; and a logic chip such as an analog-digital converter and an application-specific IC (ASIC).

The baseband circuit 620 may generate a base signal by performing analog-digital conversion, amplification of an analog signal, filtering, and frequency conversion. The base signal input/output from the baseband circuit 620 may be transmitted to the antenna device through a cable.

In an example, the base signal may be transmitted to the IC through electrical connection structures, core vias, and wiring. The IC can convert the base signal into a millimeter wave (mmWave) band RF signal.

The dielectric layer 1140 may be filled in a region in which patterns, vias, planes, lines, and electrical connection structures are not disposed in the antenna device according to the example.

Figure 15:
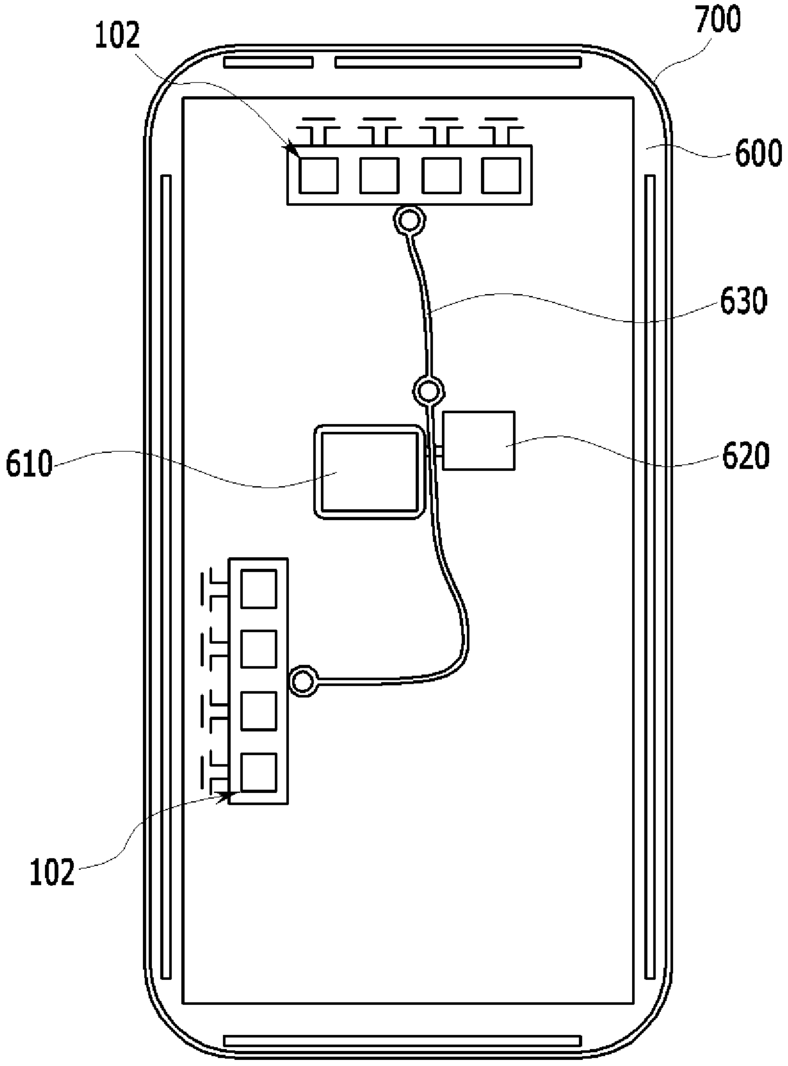
FIG. 15 is a top plan view that illustrates an alignment of an example antenna device in an example electronic device, in accordance with one or more embodiments.

FIG. 15 is a top plan view that illustrates an alignment of an example antenna device in an example electronic device, in accordance with one or more embodiments.

Referring to FIG. 15, a plurality of antenna devices each including an antenna pattern 102 may be disposed adjacent to the center of each side of a polygonal electronic device 700 on a set substrate 600 of an electronic device 700, and a communication module 610 and a baseband circuit 620 may be further disposed on the set substrate 600. The antenna device and antenna module may be connected to the communication module 610 and/or the baseband circuit 620 through a coaxial cable 630.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An antenna device, comprising:

an antenna body portion, configured to transmit and/or receive a radio frequency (RF) signal, and comprising a dielectric material having a first dielectric constant;

a metal layer, configured to contact the antenna body portion;

a first insulation layer, configured to cover at least a part of the metal layer such that the metal layer is at least partially disposed between the first insulation layer and the antenna body portion; and an electrical connection structure, configured to be electrically connected to the metal layer, wherein the first dielectric constant of the antenna body portion is larger than a dielectric constant of the first insulation layer, and is smaller than a dielectric constant of the metal layer.

2. The antenna device of claim 1, wherein the first insulation layer comprises a first opening, and the electrical connection structure is disposed inside the first opening.

3. The antenna device of claim 1, further comprising a first feed via, configured to feed to the antenna body portion.

4. The antenna device of claim 3, wherein the metal layer comprises a first opening, the first feed via is disposed inside the first opening of the metal layer, and the first feed via and the metal layer are separated from each other.

5. The antenna device of claim 3, wherein the first insulation layer is configured to surround the first feed via, while contacting the first feed via.

6. The antenna device of claim 3, further comprising a second feed via, configured to feed to the antenna body portion, wherein a first RF signal passing through the first feed via, and a second RF signal passing through the second feed via are polarized to each other.

7. The antenna device of claim 3, further comprising a strip pattern configured to be electrically connected to the first feed via, and configured to extend in a direction that is away from the first feed via.

8. The antenna device of claim 1, wherein the antenna body portion comprises a first dielectric material block, a polymer layer that is disposed on the first dielectric material block, and a second dielectric material block that is disposed on the polymer layer.

9. The antenna device of claim 8, further comprising:

a first feed via, configured to penetrate at least a part of the first dielectric material block; and a first metal patch, that is disposed on a top surface of the first dielectric material block, and is electrically connected to the first feed via.

10. The antenna device of claim 9, further comprising a second metal patch that is disposed on a top surface of the second dielectric material, and is coupled with the first metal patch.

11. The antenna device of claim 10, further comprising a second insulation layer, configured to cover the second metal patch.

12. The antenna device of claim 1, wherein the metal layer contains more than 0 wt % and less than or equal to about 5 wt % of glass based on a weight of the metal layer.

13. An antenna device, comprising:

an antenna body portion, configured to transmit and/or receive a radio frequency (RF) signal;

a metal layer, comprising a first surface configured to contact a first surface of the antenna body portion, and configured to have a planar shape that overlaps at least a part of edges of the first surface of the antenna body portion;

an insulation layer, disposed on a second surface of the metal layer, and configured to have a planar shape that overlaps at least a part of edges of the second surface of the metal layer; and an electrical connection structure, configured to contact at least a part of the second surface of the metal layer.

14. The antenna device of claim 13, wherein the electrical connection structure is disposed inside a first opening of the insulation layer.

15. The antenna device of claim 14, further comprising a first feed via, configured to be connected to a bottom surface of the antenna body portion.

16. The antenna device of claim 15, wherein the first feed via and the metal layer are separated from each other.

17. The antenna device of claim 16, wherein the first feed via is disposed inside a first opening of the metal layer, and is further disposed inside a second opening of the insulation layer.

18. The antenna device of claim 15, further comprising a second feed via, configured to be connected to a bottom surface of the antenna body portion.

19. The antenna device of claim 18, wherein the second feed via and the metal layer are separated from each other.

20. The antenna device of claim 19, wherein the second feed via is disposed inside a second opening of the metal layer, and is further disposed inside a third opening of the insulation layer.

* * * * *